(12) United States Patent
Taran et al.

(10) Patent No.: US 6,410,937 B1
(45) Date of Patent: Jun. 25, 2002

(54) INTEGRATED CIRCUIT CHIP CARRIER

(76) Inventors: Alexsander Ivanovich Taran, 103575, Zelenograd, korp. 1001, kv8; Viktor Konstantinovich Ljubimov, 103482, Zelenograd, korp. 360, rv375, both of Moscow (RU)

( * ) Notice: Subject to any disclaimer, the term of this patent is extended or adjusted under 35 U.S.C. 154(b) by 0 days.

(21) Appl. No.: 09/529,019
(22) PCT Filed: Mar. 3, 1999
(86) PCT No.: PCT/RU99/00060
§ 371 (c)(1),
(2), (4) Date: Apr. 3, 2000
(87) PCT Pub. No.: WO00/35009
PCT Pub. Date: Jun. 15, 2000

(30) Foreign Application Priority Data

Dec. 8, 1998 (RU) .......................... 98121771

(51) Int. Cl.⁷ .............................. H01L 23/58
(52) U.S. Cl. ..................... 257/48; 257/273; 257/774; 361/777
(58) Field of Search ................. 257/273, 774, 257/775, 686, 48; 361/777, 774, 760, 772

(56) References Cited

U.S. PATENT DOCUMENTS

| | | |
|---|---|---|
| 4,562,301 A | 12/1985 | Kamada et al. |
| 4,692,843 A | 9/1987 | Matsumoto et al. |
| 5,625,224 A | 4/1997 | Greenwood et al. |
| 5,703,400 A * | 12/1997 | Wojnarowski et al. ...... 257/723 |
| 5,717,247 A * | 2/1998 | Koh et al. .................. 257/686 |
| 5,936,848 A * | 8/1999 | Mehr et al. ................. 361/777 |
| 5,973,396 A * | 10/1999 | Farnworth .................. 257/698 |
| 6,180,506 B1 * | 1/2001 | Sullivan ..................... 438/618 |
| 6,184,133 B1 * | 2/2001 | Iijima et al. ............... 438/667 |

FOREIGN PATENT DOCUMENTS

| | | |
|---|---|---|
| EP | 0 214 621 | 3/1987 |
| WO | WO 92/21150 | 11/1992 |

* cited by examiner

*Primary Examiner*—Lincoln Donovan
*Assistant Examiner*—Kyung S. Lee
(74) *Attorney, Agent, or Firm*—Knobbe, Martens, Olson & Bear, LLP

(57) ABSTRACT

An IC chip carrier has a base formed from a film of dielectric material and a system of oriented and fixed conducting paths on a top surface of the base. A first group of the conducting paths is configured to mate directly with chip contact pads and a second group of the conducting paths is configured to mate with mating contacts on a circuit board. The IC chip carrier includes further a plurality of contacts for selectively connecting to the mating chip contact pads and the mating contacts on the circuit board. All contacts are formed as metallized vias having top edges coupled to the conducting paths on the top surface of the base, wherein bottom edges of the vias form contact assemblies with the mating contact pads of the chip or with mating contact pads of the circuit board. The contact assemblies are formed through joints filled with an electric-conductive binder, wherein the mating contact pads of the chip and the mating contact pads of the circuit board face the vias, and wherein the contact assemblies together with conducting paths are configured to electrically couple the chip contact pads directly with contact pads of the circuit board.

12 Claims, 4 Drawing Sheets

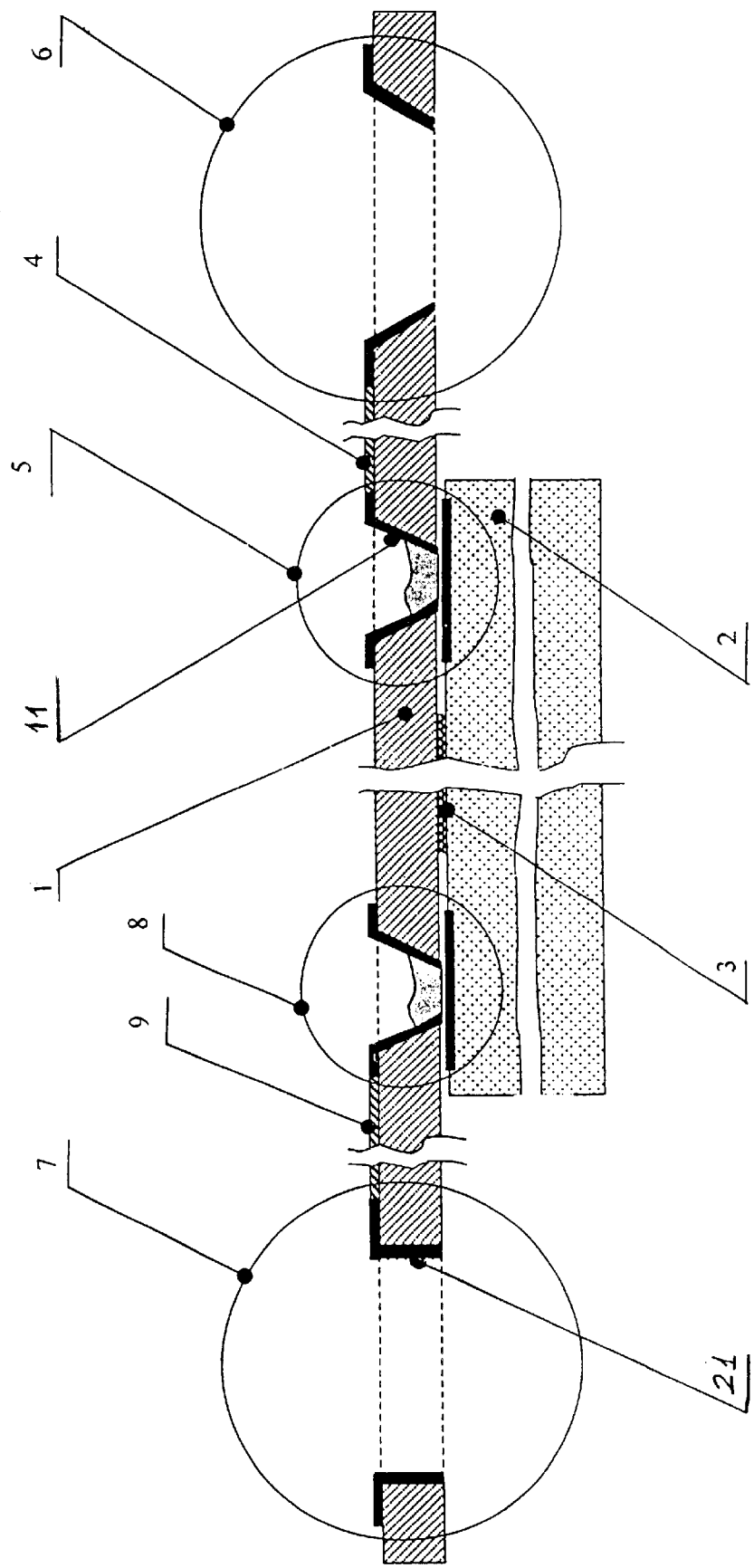

INTEGRATED CIRCUIT CHIP CARRIER

RELATED APPLICATIONS

This application is related to SINGLE-CHIP INTEGRATED CIRCUIT MODULE, application Ser. No. 09/529,034, filed on the same date.

FIELD OF THE INVENTION

The present invention relates to the development and manufacture of the equipment based on microelectronics items and semiconductor devices, and can be widely used for checking and rejecting IC chips prior to their mounting into packages or as a part of multichip modules, as well as for mounting chips into packages or multichip modules. The invention is directed onto reducing the cost of rejecting procedures for chips, for decreasing the labor content of equipment assembly mounting processes, for increasing a yield percentage of fit items, and also for raising a chip operation reliability in the equipment.

An application of this invention seems to be especially prospective in manufacturing a large-scale electronic equipment with high specific characteristics in the form of multichip modules (MCM).

BACKGROUND OF THE INVENTION

At present, IC chip carriers on a film base, particularly on the polyimide film, have a wide spreading. A high thermal stability, stability of electrophysical and thermomechanical characteristics in operation, high mechanical rupture, tensile and breaking strength in the thickness range of 7 to 100 $\mu$m, resistance to chemical attacks and high temperatures during technological treatment should be ascribed to advantages of the polyimide based carrier. Such carrier ensures an automation of mounting processes for chip with a large number of contact pads, since conducting paths on a carrier surface could be made with a high accuracy and disposed with a high density having a small, strictly fixed gap between them.

A one-layer carrier with spider leads is known, manufactured from the polyimide film with a copper or aluminum foil glued on it, in which foil conducting paths are etched by photolithography techniques. Chip contact pads are connected to the conducting paths by welding or soldering techniques, and other, free ends of those paths are used for measuring and subsequent welding or soldering to mating contacts in a package or to a circuit structure in a packageless mounting (A. Yu. Ber, F. E. Minsker. <<Mounting of semiconductor devices and integrated microcircuits>>, Moscow, <<High School>> Publishing House, 1986, pp.147–150—in Russian).

A polyimide chip carrier is known, which is employed in manufacturing an electronic equipment based on packageless LSIC, comprising a system of rigidly oriented tape conductors (from copper or aluminum) of 20 to 30 $\mu$m wide displaced on a surface of the polyimide film carrier and spaced in a chip area with a step compatible with a step of contact pads on the chip and in a carrier periphery with a step compatible with mating mounting pads on a circuit board. Besides, all conductors are represented by contacts displaced at carrier edges with a step compatible with a step of probe contacts in a measuring apparatus. Conductors being rigidly fixed relative to each other are welded to LSIC contact pads, and continuations of these conductors, after corresponding cutting, are welded or soldered to mating contact pads on the circuit board. Thus, each contact pad of the chip and its mating contact pad on the polyimide carrier along with a connecting element in the form of the conducting path on the polyimide carrier form a contact assembly intended for coupling electrically the chip contact with the mating contact on the circuit board. Prior to cutting the chip for mounting the chip onto the circuit board, the carrier with the chip is placed into a contact device of the measuring apparatus to monitor electrical and functional chip parameters and to reject imperfection chips (E. N.Panov, <<Peculiarities of assembling the application-specific high-integration IC's on base array master chips>>, Moscow, <<High School>> Publishing House, 1990, pp.77–78,—in Russian).

A two-layer carrier is known which has metallized paths in two layers separated by a polyimide insulation layer. Such carrier allows to mount chip having a large number of contact pads displaced along a chip periphery, including those displaced in two lines as on a chessboard (ibid, p.78).

A two-layer carrier on a flexible base, comprising a signal layer, layers of the supply bus and ground bus insulated from each other, is known. Conducting paths displaced on surfaces of polyimide carrier layers are coupled to each other by means of metallized vias made in the polyimide base of carrier layers. The coupling of conducting paths with IC chip contact pads is performed by means of welding.

Such carrier embodiment has permitted to avoid many problems inherent to carrier on a rigid base, particularly an impossibility to optimize signal buses and ground and supply buses within one layer, and to ensure a resistance to bending forces during technological operations (<<Second birth<< of the automated mounting of chips on a tape carrier. Express information on the abroad electronic technology. Part 43–45 (5205–5207) of Mar. 1–5, 1991, Moscow—in Russian).

While mounting onto the circuit board, contact assemblies in the polyimide carrier structure have electrical characteristics substantially better than corresponding characteristics of contact assemblies in cermet package structure (for which packages the way of the electric signal is: chip contact pad—transitional wire element—mating contact pad of a cross-arm—transitional conductors in a multilayer circuit structure of the cermet package—package output terminal) in basic electrical characteristics (a resistance value, a parasite terminal inductance and a parasite intra-terminal capacity). Besides, a usage of the polyimide carrier ensures a good matching of welded chip conductors and contact pads while mounting, which substantially improves an automation of mounting processes and reduces the cost of the chip mounting both in packages or within an equipment assemblies based on packageless ones.

However, the above one-layer, two-layer and three-layer polyimide chip carriers, solving tasks in improving the registration precision of contact pads and conductors and fixation of conductors relative to each other, in improving the electrical characteristics of contact assemblies elements, in combining processes of parameter measurements, rejection and mounting of chips on a circuit board in a single technological route, have the following substantial disadvantages:

technological processes (welding the tape conductors to contact pads of chips) are used in mounting, which can cause a defect formation in chips and reduction of their reliability characteristics in operation;

the welding process is a non-group operation, i.e. each welded contact is processed individually, serially one after another, which reduces sharply a mounting productivity and increases a probability of a welding machine malfunction, especially for multiterminal chips.

A technical decision most close to the present invention in the technical essence and obtained result when using is a chip carrier comprising a base from a dielectric material, polyimide, with conducting paths formed on its surface, to which said chip is glued so as to coincide contact pads with corresponding conducting paths on the carrier surface. After welding (or soldering) conducting paths to corresponding chip contacts, carrying out parameter testing and rejection of fit chips, a periphery chip area having measuring contact pads is cut off, and the remaining part of the carrier with the chip is positioned on a circuit board; then contact pads of a central carrier zone are welded (or soldered) to mating mounting pads on the circuit board (E. N. Panov, <<Peculiarities of assembling the application-specific high-integration IC's on base array master chips>>, Moscow, <<High School>>Publishing House, 1990, p.78—in Russian).

The main disadvantages of this technical decision for complex multiterminal IC are:
   a usage of the defect-creating welding process;
   a non-group character of the mounting process.

SUMMARY OF THE INVENTION

The problem, for which solving the present invention is directed, is to provide a multiterminal chip carrier comprising contact assemblies of an original structure, which usage permit to exclude the defect-creating welding process and to make the process of connecting the conductors to the chip contact pads a group process, which leads to a significant reduction of a labor content and cost of a carrier assembling and chip mounting into a package or as a part of a multichip module for improving a quality, reproducibility and reliability of connections.

In addition, a usage of the proposed contact assembly permits to solve one of the main problems of multichip modules, namely the rejection of obviously fit chips prior to their mounting as a part of MCM, at the cost of improving the testability of packageless IC chips and ensuring a total chip testing through output terminals of the carrier.

The indicated technical result is attained at the expense of using special assemblies in the carrier structure, which ensure an electrical and mechanical coupling between contacts.

The set problem is solved with an attainment of the mentioned technical result by that in an IC chip carrier comprising a base of a dielectric material with a system of oriented and fixed conducting paths on its surface and contacts, ones of which are intended for connecting with mating chip contact pads and others are intended for connecting with mating contacts on a circuit board, which contacts are made in the form of metallized vias which top edges are coupled with the conducting paths on the top surface of the carrier base, and bottom edges of vias form contact assemblies in joints with the mating contact pads of the chip or, respectively, with mating contact pads of the circuit board filled with an electric-conductive binder, which assemblies together with conducting paths ensure an electric coupling of the chip contact pads with contact pads on the circuit board;

and also by that the metallized vias for the chip contact pads and for the contact pads of a multilayer circuit board are made of different diameters;

and also by that the metallized vias are made in the form of a cylinder;

and also by that the metallized vias are made in the form of frustums of a cone, the lesser bases of said frustums of a cone being faced to the contact pads on the surface of the chip or multilayer circuit board and the greater bases of said frustums of a cone being coupled with the conducting paths on the surface of the carrier base;

and also by that the metallized vias for contacting with the contact pads of the multilayer circuit board are made with metallized rings on the top and bottom surfaces of the carrier base;

and also by that the metallized vias in the carrier for the chip contact pads can be made in the form of an array displaced over the surface of the chip having contact pads coincided in their placement with the array of the carrier vias;

and also by that the carrier base is made from the polyimide film;

and also by that the carrier can be made multilayer;

and also by that the top edges of metallized vias coupled with the conducting paths on the top surface of the carrier base are made with metallized rings;

and also by that the conducting paths connecting the chip contact pads with the metallized vias at the periphery of the multilayer carrier are made in the form of strip lines;

and also by that several IC chips are disposed on one multilayer carrier.

BRIEF DESCRIPTION OF THE DRAWINGS

The invention is illustrated by drawings wherein FIG. 1, FIG. 1a, FIG. 2 and FIG. 3 depict diagrammatically fragments of the proposed carrier.

FIG. 1 represents one of possible embodiments of the carrier in accordance with the present invention.

FIG. 2 (in great ovals at the left and at the right) shows examples of the connection of the carrier output terminals with the mating contacts of external circuit structures: at the right—with the contact in the form of a flat contact pad, and at the left—with the contact in the form of a pin.

FIG. 1a shows in the enlarged view a contact assembly on which basis is embodied the carrier in accordance with the present invention.

FIG. 3 depicts a variant of the multilayer carrier (two layers) in which the conducting paths are made in the form of flat lines.

DETAILED DESCRIPTION OF THE INVENTION

Figure 1A:
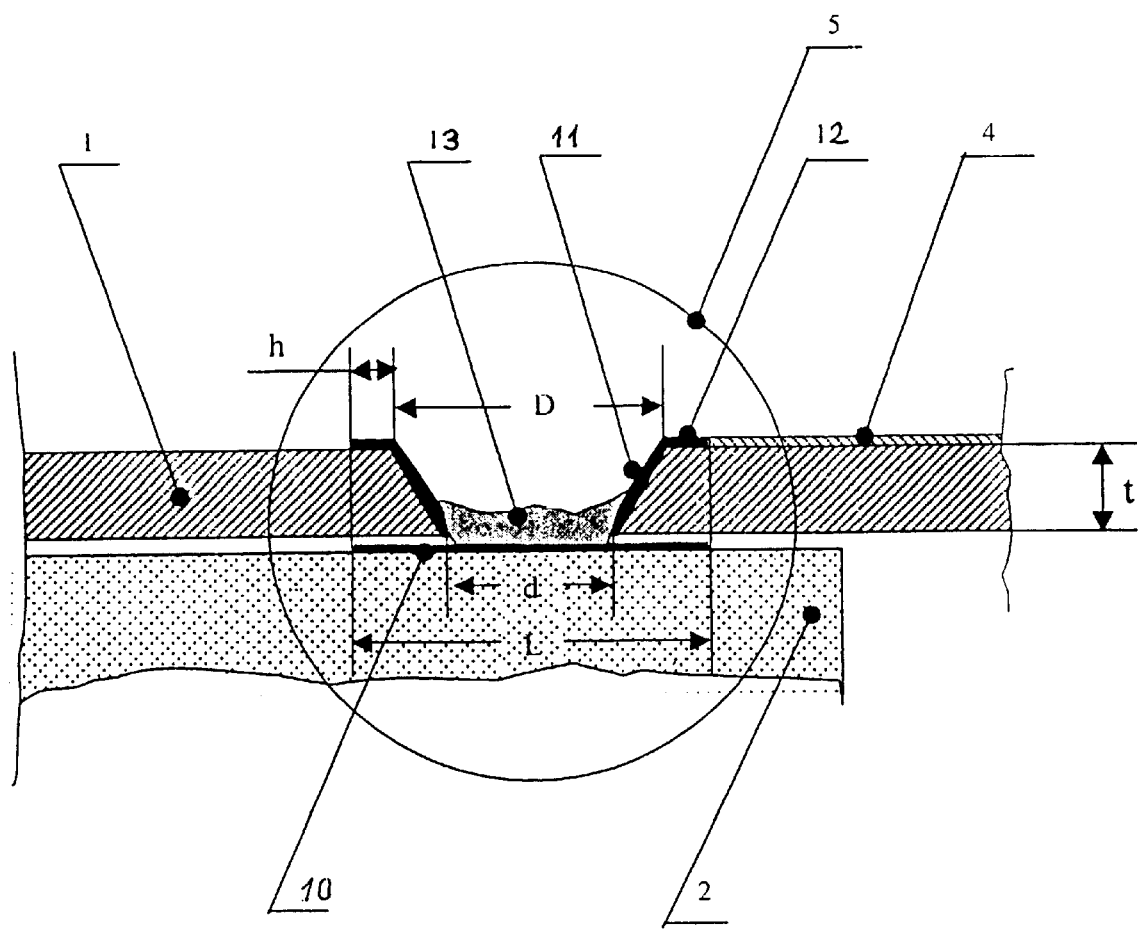

A chip carrier (FIG. 1) consists of a circuit layer 1 being a base from a film insulating material as which a polyimide film, for example, can be used, on a top surface of which film are displaced conducting paths 4, 9, and on its bottom surface a chip 2 is fixed by means of an adhesive compound 3, for example. The conducting path 4 couples a contact assembly 5 with a metallized via 11 in the form of a frustum of a cone, and a conducting path 9 couples a contact assembly 7 with a metallized via 21 in the form of a cylinder. The contact assemblies will be described in more detail below by examples of FIG.2 and FIG. 1a.

Figure 2:
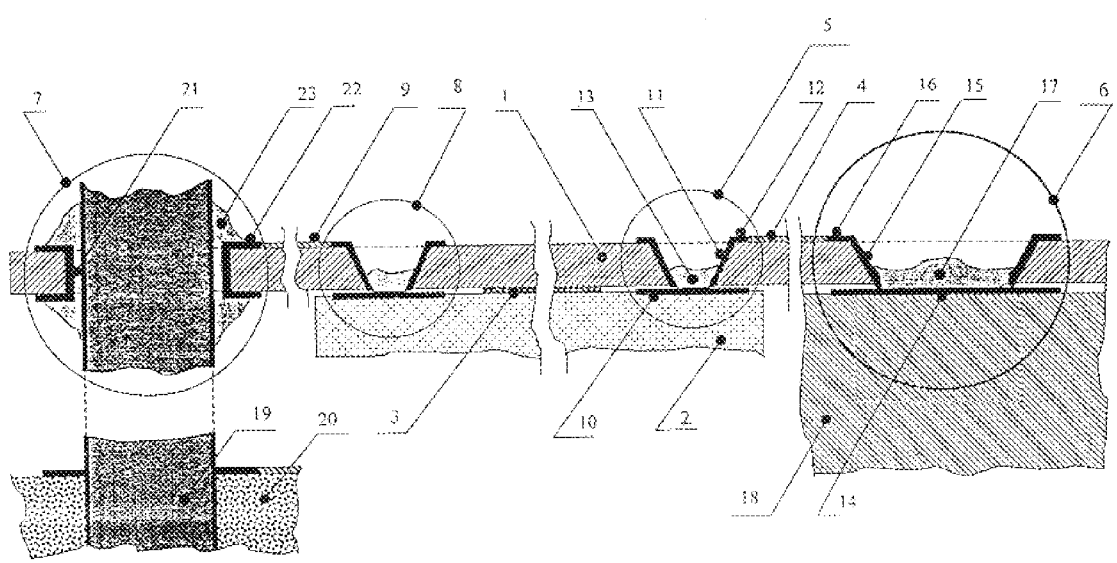

In FIG.2 examples of connection of the carrier output terminals with the mating contacts of external circuit structures are shown diagrammatically.

In the right oval is depicted the contact assembly 6 connecting a contact pad 14 on the surface of some circuit layer 18 with the conducting path 4 on the surface of the circuit layer 1 by means of a metallized ring 16, metallized via 15 in the form of frustum of a cone, and a conductive binder 17. The metallized path 4 is coupled with its another end with a contact pad 10 of the chip 2 by means of a metallized ring 12 of a metallized via 11 made in the form of frustum of a cone, and a conductive binder 13 of the contact assembly 5. The contact assembly 6 is similar by its structure embodiment to the contact assembly 5 and differs from the latter only by element sizes.

In the left oval is depicted a contact assembly 7 connecting a pin contact 19 fixed in some external circuit layer 20 perpendicularly to its surface and inserted into the mating metallized via 21 of a cylinder form, which is coupled through a metallized ring 22 with the conducting path 9 on the surface of the circuit layer 1 of the carrier. An electric-conductive binder 23 in a gap between the pin contact 19 and the metallized via 21 ensures a reliable coupling of element of the contact assembly 7.

In FIG. 1a in an oval is depicted an enlarged fragment of the carrier having the contact assembly 5 in the form of a joint between a contact pad 10 of the chip 2 and the metallized via 11 in the insulation layer 1, made in the form of frustum of a cone, the greater base of which is coupled with the conducting path 4 on the top side of the carrier through the metallized ring 12. An electric-conductive binder 13 introduced into the joint area couples the contact pad 10 of the chip 2 and the metallized via 11 of the carrier into the common contact assembly 5.

Figure 3:
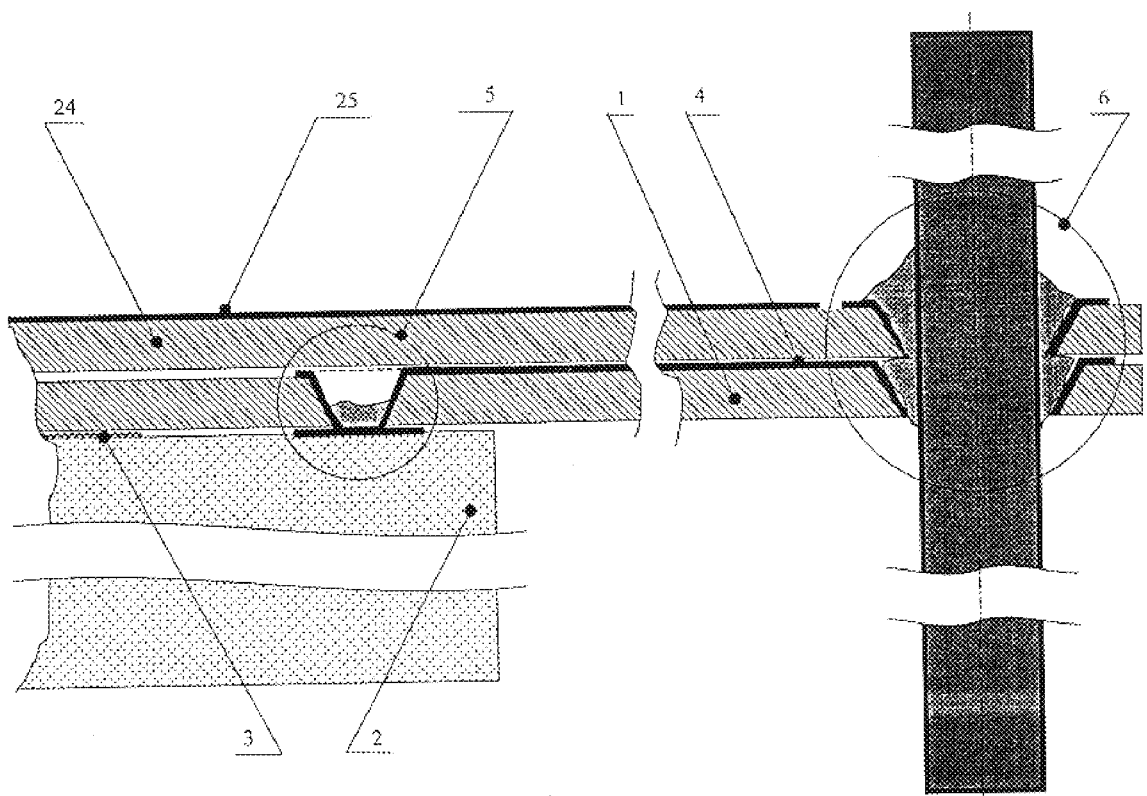

In FIG.3 is depicted a multilayer IC chip carrier comprising at least two insulation layers 1 and 24. Metallized paths 4 connecting the contact assemblies 5 and 6 are disposed on the top surface of the first insulation layer. A metallized path 25 being the <<ground>> bus is disposed on the top surface of the layer 24. The metallized paths 4 and 25 form a strip line connecting the contact assemblies 5 and 6 and being a guide for microwave signals.

In mounting the contact assemblies by means of a binder evaporation the metallized vias of the carrier are coincided with the contact pads of the chip fixed on the carrier, after which a mounted technological packet is put into an evaporation apparatus, where a serial layer by layer evaporation of conductive materials forming the conducting binding structure having required features is carried out. In such way a group mounting of the contact assemblies coupling the chip contact pads with the conducting paths and metallized vias for the output terminals is performed. After connecting contacts in the evaporation apparatus, an operation of visual and electric quality testing of the formed contact assemblies is performed, if necessary.

In mounting the contact assemblies by the soldering technique, a technological packet (consisting of the carrier and the chip fixed on it) is placed into a vacuum soldering apparatus. In conditions of a partial vacuum and common heating till the solder fusion temperature, under capillary forces, a soldering of the joints in each contact assembly takes place simultaneously in the whole central zone of the carrier.

An interaction of the carrier elements and chip during functioning occurs as following (by example of the fragment in FIG.2).

A signal from the contact pad 14 of the circuit layer 18 passes through the electric-conductive binder 17, metallized via 15 in the circuit layer 1, metallized ring 16, all of which form the contact assembly 6, into the conducting path 4 on the top side of circuit layer 1, and then through the metallized ring 12, metallized via 11 in the circuit layer 1 and electric-conductive binder 13 onto the contact pad 10 of the chip 2.

Similarly, a signal from the contact pad of the chip included as an element in the contact assembly 7 through the conducting path 9 on the surface of the circuit layer 1 of the carrier passes through the metallized ring 22, metallized via 21 of the cylinder form, and electric-conductive binder 23 of the contact assembly 7 onto the contact 19 in the form of a pin fixed in the circuit layer 20.

Thus, a manufacture of the chip carriers with the contact assemblies of the proposed structure allows to ensure:

a high reproducibility and reliability of a large number of the contact assemblies in a <<carrier—chip>> system;

a high interconnection density with the optimum number of layers (from the viewpoint of the carrier manufacture producibility and cost);

a high precision of mounting elements within the carrier, sufficient for mounting the multilayer modules;

a structure simplicity determining the high producibility and low cost in manufacturing the carriers, including multilayer ones;

a possibility to use the chips with an array placement of the contact pads uniformly dispersed on the chip surface, which is very topical in connection with a growth of the contact pad number on the IC chips of the high-scale integration;

a simplicity and comfort in carrying out a reliable chip parameter testing when rejecting the obviously fit chips prior to their mounting within the one-layer and multilayer modules;

a usage of the multilayer carrier for the IC chips of the high-scale integration with a large number of the contact pads;

a testing and rejecting of the obviously fit IC chips with clock frequencies in the range of gigahertz and their following packing into one-chip and multi-chip modules;

a placement of several IC chips on one multilayer carrier.

What is claimed is:

1. An integrated circuit (IC) chip carrier, comprising:
a base formed from a film of dielectric material;
a system of oriented and fixed conducting paths on a top surface of the base, wherein a first group of said conducting paths is configured to mate directly with chip contact pads and a second group of said conducting paths are configured to mate with mating contacts on a circuit board; and
a plurality of contacts for selectively connecting to the mating chip contact pads and the mating contacts on the circuit board, wherein said plurality of contacts are formed as metallized vias having top edges coupled to the conducting paths on the top surface of the base, and wherein bottom edges of the vias form contact assemblies with the mating contact pads of the chip or with mating contact pads of the circuit board through joints filled with an electric-conductive binder, wherein the mating contact pads of the chip and the mating contact pads of the circuit board face the vias, and wherein the contact assemblies together with conducting paths are configured to electrically couple the chip contact pads directly with contact pads of the circuit board.

2. The IC chip carrier of claim 1, wherein the metallized vias forming the contact assemblies with the chip contact pads and contact pads of a multilayer circuit board have different predetermined diameters.

3. The IC chip carrier of claim 1, wherein the metallized vias are formed as cylinders.

4. The IC chip carrier of claim 1, wherein the metallized vias are formed as frustums of a cone, smaller bases of said frustums of a cone facing the contact pads on the surface of the chip or multilayer circuit board and larger bases of said frustums of a cone being coupled to the conducting paths on the surface of the carrier base.

5. The IC chip carrier of claim 1, wherein the top edges of the metallized vias coupled to the conducting paths on the top surface of the carrier base are made with metallized rings.

6. The IC chip carrier of claim 1, wherein the metallized vias for contacting the contact pads of the circuit board are made with metallized rings on the top and bottom surfaces of the carrier base.

7. The IC chip carrier of claim 1, wherein the carrier base comprises a polyimide film.

8. The IC chip carrier of claim 1, wherein the metallized vias in the carrier for the chip contact pads are formed as an array displaced over a surface of the chip whose contact pads are displaced similarly to an array of vias of the carrier.

9. The IC chip carrier of claim 1, wherein the carrier is a multilayer carrier.

10. The IC chip carrier of claim 9, wherein the conducting paths connecting the chip contact pads with the metallized vias at a periphery of the multilayer carrier are formed as strip lines.

11. The IC chip carrier of claim 9, wherein several IC chips are disposed on one multilayer carrier.

12. An integrated circuit (IC) chip carrier, comprising:

a base formed from a film of dielectric material;

a system of oriented and fixed conducting paths on a top surface of the base, wherein a first group of said conducting paths is configured to mate directly with chip contact pads and a second group of said conducting paths are configured to mate with mating contacts on a circuit board; and a plurality of contacts for selectively connecting to the mating chip contact pads and the mating contacts on the circuit board, wherein said plurality of contacts are formed as metallized conic vias having top edges coupled to the conducting paths on the top surface of the base, and wherein bottom edges of the vias form contact assemblies with the mating contact pads of the chip or with mating contact pads of the circuit board through joints filled with an electric-conductive binder, wherein the mating contact pads of the chip and the mating contact pads of the circuit board face the vias, and wherein the contact assemblies together with conducting paths are configured to electrically couple the chip contact pads directly with contact pads of the circuit board.

* * * * *